United States Patent [19]

Vig

[11] 4,354,133

[45] Oct. 12, 1982

[54] HERMETICALLY SEALED CONTAINER

[75] Inventor: John R. Vig, Colts Neck, N.J.

[73] Assignee: The United States of America as represented by the Secretary of the Army, Washington, D.C.

[21] Appl. No.: 182,540

[22] Filed: Aug. 29, 1980

[51] Int. Cl.³ .......................... C25D 11/00; H01J 5/00
[52] U.S. Cl. ................................ 310/344; 174/52 FP; 174/50.63; 204/16; 228/121
[58] Field of Search ................ 310/344, 348; 228/121, 228/123, 124, 188, 110, 198, 120, 122; 65/69; 204/16, 58; 174/52 FP, 525, 17.05, 50.61, 50.63

[56] References Cited

U.S. PATENT DOCUMENTS

| 2,388,242 | 11/1945 | Arndt, Jr. | 228/121 |
| 3,901,772 | 8/1975 | Guillotin et al. | 204/16 |
| 3,914,836 | 10/1975 | Hafner et al. | 228/110 |
| 3,931,388 | 1/1976 | Hafner et al. | 310/344 |
| 3,951,327 | 4/1976 | Snow et al. | 228/121 |
| 4,038,157 | 7/1977 | Kim et al. | 204/16 |

Primary Examiner—J. D. Miller
Attorney, Agent, or Firm—Nathan Edelberg; Jeremiah G. Murray; Michael C. Sachs

[57] ABSTRACT

An improved hermetically sealed container is disclosed having a receptacle with at least one opening for mounting a desired element in the opening, a closure element covering each opening, a metallized seal between the closure element and the receptacle with the metallized seal peripherally surrounding the opening and hermetically sealing the closure element to the receptacle, and a sealing deposit electrolytically applied to the outer surface of the metallized seal. A method of making such a hermetically sealed container is also disclosed.

5 Claims, 2 Drawing Figures

HERMETICALLY SEALED CONTAINER

STATEMENT OF GOVERNMENT INTEREST

The invention described herein may be manufactured and used by or for the government for governmental purposes without the payments of royalties thereon or therefor.

FIELD OF THE INVENTION

The present invention relates to hermetically sealed containers and methods of making such containers. More particularly, the invention relates to hermetically sealed containers for crystal resonators.

BACKGROUND OF THE INVENTION

Hermetically sealed containers are important in many applications. For example, crystal resonators are widely used as a secondary frequency standard or as a frequency source in many different electronic applications. It is of prime importance for the proper operation of electronic devices including such a resonator that the resonator have stable frequency characteristics over a period of time.

As is noted in Hafner et al. U.S. Pat. No. 3,931,388, several factors can cause changes in the frequency characteristics of crystal resonators, e.g., changes in mass of the resonator, the pressure inside the resonator enclosure, stress on the resonator, electrode to quartz interfaces, and the quartz's crystal structure. The pressure changes inside the resonator enclosure can be caused by, inter alia, outgassing and leaks due to flaws in the packaging seals. Thus, one method of increasing the stability of such frequency characteristics is to enclose the crystal resonator in a hermetically sealed container to reduce such pressure changes.

The Hafner et al. '388 patent discloses a crystal resonator package which is said to avoid some of the above-noted problems. Specifically, an apparatus is disclosed for housing a crystal resonator comprising an insulator "frame-like" housing having an opening capable of surrounding a major portion of the crystal, wherein the frame member includes a metallic conducting material embedded in a sidewall of the frame and directed from the opening to an outside wall of the frame, and wherein at least one support member is secured to the frame and within the opening. The support member is electrically coupled to the metallic conducting material and is capable of supporting the crystal in a desired vibratory mode. The patent also mentions means coupled to the frame for hermetically sealing the crystal within the opening. As the hermetically sealing means, the Hafner et al. '388 patent suggests frame members 12 having top and bottom surfaces which are metallized and a lid member 40 corresponding to the top surface of the frame member 12 having underneath surfaces which are also metallized. Hafner et al. also suggest that a wire O-ring can be used between the metallized surfaces to compensate for small surface irregularities and contaminants. The metallized surfaces are used to form the hermetic seal. For example, in columns 5 and 6 of the Hafner et al. patent, they suggest that such metallized surfaces can be sealed by a number of different methods, including cold welding, thermocompression bonding, electron beam welding, laser welding, parallel seam and other resistance welding, ultrasonic bonding and reflow soldering.

A similar container for crystal resonators is also disclosed in Snow et al. U.S. Pat. No. 3,951,327. The Snow et al. patent discloses a ceramic to metal seal which is said to provide a hermetic seal. The metal to ceramic seal is said to be formed by heating a wire-like metal gasket and chemically cleaned ceramic member, while simultaneously deforming from about 50 to 95% the metal gasket against the ceramic member at a temperature of about 30 to 75% of the melting temperature of the metal gasket.

A method of packaging crystal resonators is also disclosed in Hafner et al. U.S. Pat. No. 3,914,836. This Hafner et al. patent discloses a method for processing crystal resonators in which certain process steps are performed in a vacuum system without venting between stages, including processing steps of cleaning the resonator parts to remove contaminants from the surface, baking the resonator parts at temperatures up to 450° C. to further remove adsorbed and absorbed contaminants, plating electrodes onto the crystal resonator, and sealing the resonator parts. As the sealing means, Hafner et al. in column 2 suggest cold welding of similar metal surfaces under near zero pressures or by compression welding in situations where the surfaces are contaminated. The former sealing method is said to rely on the adhesion between atomically cleaned surfaces. The Hafner et al. patent also mentions that one or more small diameter O-rings of a suitable material plus pressure and heat (if necessary) can be used to compensate for small surface irregularities and contaminants. As an alternative, Hafner et al. suggest that O-rings can be replaced with one or more ridges on one of the sealing surfaces.

Containers for crystal resonators and methods for making such containers are also disclosed in Technical Report ECOM 4134, "Packaging Crystal Resonators" by J. Vig and E. Hafner, July 1973.

In summary, any improvement in the pressure characteristics of a container enclosing a crystal resonator is important in many applications since stabilizing the pressure will help to create a more constant frequency. Thus, while good hermetic seals can be obtained by the containers and methods of the prior art, any improvement in such hermetic seals would be highly desirable.

SUMMARY OF THE INVENTION

It has now been found that containers having an improved hermetic seal can be provided by a container comprising a receptacle having at least one opening for mounting a desired element in said opening; a closure element covering each said opening; a metallized seal between said closure element and said receptacle, said metallized seal peripherally surrounding said opening and hermetically sealing said closure element to said receptacle; and a sealing deposit electrolytically applied to the outer surface of said metallized seal. The electrolytically applied sealing deposit serves to fill in microscopic and/or atomic voids in the seal between the receptacle and closure element, thus improving the hermetic seal. This is particularly important with containers enclosing a crystal resonator, e.g., a ceramic flatpack, since such an improved hermetic seal improves the long-term aging characteristics (i.e., changes in frequency with time) of the crystal resonator assembly.

In a preferred embodiment of the present invention, the metallized seal is formed from a metallized gasket, usually in the form of a wire O-ring. The metallized gasket is disposed between the receptacle and closure element and hermetically sealed therebetween by any convention means. The gasket compensates for small surface irregularities and contaminants present in the surfaces on the receptacle and closure element. The electrolytically applied sealing deposit in this embodiment is thus applied on the outer surface of the seal created by the gasket.

As one convenient method for applying the electrolytically deposited sealing surface onto the outer surface of a metallized seal between the receptacle and closure element, the wire O-ring gasket preferably is provided with a tab which can be used for the electrical connection to the seal in order to provide anodic or cathodic potential for application of the electrolytic sealing deposit. After the sealing deposit is applied to the outer surface of the metallized seal, the tab can be removed.

In another preferred embodiment of the present invention, the metallized seal is a first metallized surface on said receptacle peripherally surrounding said opening and a second metallized surface on said closure element, said first and second metallized surfaces being hermetically sealed together between said receptacle and said closure element.

In still another preferred element of the invention, the metallized seal is a gold seal and the sealing deposit is an electroplated gold deposit. The gold seal can be formed either by gold surfaces on the receptacle and closure element or by a gold gasket between the receptacle and closure element or a combination of such an arrangement.

In yet another preferred embodiment of the present invention, the metallized seal is an aluminum seal and the sealing deposit is an electrolytically applied aluminum oxide anodizing coating. Again, the metallized seal can be formed from aluminum surfaces on the receptacle and closure element, by a gasket between the receptacle and closure element or by a combination of such sealing arrangements.

The present invention also includes a method of making a hermetically sealed container. In the method, a metallized hermetic seal is formed between a receptacle (having an opening for mounting a desired element) and a closure element for the receptacle. At least the exposed outer surface of the metallized seal is then contacted with an electrolyte-containing material capable of being electrolyzed to form a sealing deposit on at least such exposed outer surface of the metallized seal. The electrolyte-containing material and metallized seal are then electrolyzed to form the sealing deposit on at least the exposed outer surface of the metallized seal. Preferably, a suitable electrical circuit for the electrolyzing step is connected to the metallized seal by means of a metal tab attached to the metallized seal, e.g., a tab on a sealed metallized gasket.

DETAILED DESCRIPTION OF THE INVENTION

Figure 1:
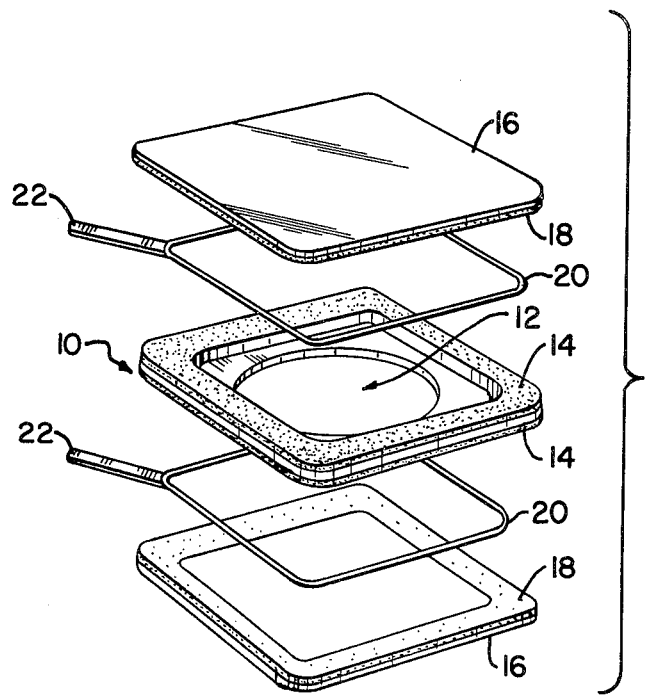
FIG. 1 is a perspective view of one embodiment of the container of the present invention exploded so as to illustrate the positions of the various elements of the container.

As noted above, the container of the present invention includes a receptacle having at least one opening. The receptacle can accommodate any device or element which is desired to be hermetically sealed from the environment exterior to the container, for example, an electrical circuit or a crystal resonator. In a particularly preferred embodiment, the receptacle is intended for mounting of a crystal resonator, such as a piezoelectric crystal resonator, e.g., a quartz crystal resonator. Such receptacles and the various mountings of the crystal resonators therein are well-known in the art as is illustrated in the Hafner et al. and Snow et al. patents discussed above. Normally, the receptacle is a portion of a "ceramic flatpack." A typical receptacle will be a rectangular or square frame fabricated of alumina or berriyllia ceramic and having an opening through the receptacle (e.g., as illustrated in FIG. 1 of the present application and FIG. 4 of U.S. Pat. No. 3,951,327). The receptacle can, however, be fabricated of a suitable metal, but if a crystal resonator is to be mounted within the receptacle, ceramic or glass feedthroughs are employed to insulate the crystal resonator. The crystal resonator is mounted in the opening by the use of mounting clips, e.g., as illustrated in U.S. Pat. No. 3,931,388. Thus, various forms of receptacles and mounting arrangements can be used and all such forms and arrangements are contemplated by the present invention.

The container of the present invention also includes a closure element, e.g., a lid. Again, such closure elements are well-known in the art, e.g., see the Hafner et al. and Snow et al. patents. As with the receptacle, the closure element can take many forms, such as metal or ceramic. Suitable metals include gold, a Mo-Mn alloy or tungsten. Ceramic closure elements are preferred.

The closure element and receptacle components of the present container are hermetically sealed by means well-known in the art, e.g., as disclosed in the Hafner et al. and Snow et al. patents discussed above. The receptacle and closure elements are hermetically sealed together by a metallized seal between the closure element and the receptacle. The metallized seal surrounds the opening of the receptacle.

The metallized seal can take various forms and compositions. For example, deformable metallized surfaces can be included on the receptacle surrounding the opening and on the closure element. Such metallized surfaces can be, for example Al, Au, Mo-Mn, or W, but Al or Au surfaces are preferred. The techniques for making such metallized surfaces are well-known, e.g., the techniques for metallizing ceramic surfaces are well-known in the art, e.g., such techniques are described in "Advanced Interconnection and Packaging Techniques for Integrated Circuits," by R. W. Ilgenfritz, J. S. Koekane and W. D. Walter, all of Raytheon Company, Final Report, Contract No. DAA-B07-69-0472, June, 1972. These metallized surfaces should be free of contaminants to permit clean metal-to-metal adhesion to occur. The metallized surfaces can be hermetically sealed under the desired reduced pressure by any conventional means, for example, by cold welding, thermocompression bonding, electron beam welding, laser welding, parallel seam and other resistance welding, ultrasonic bonding, reflow soldering, etc. Cold welding is a preferred technique because it reduces the potential for outgassing.

The metallized seal can also be a metallized gasket, such as an Al, Au, Mo-Mn or W gasket, hermetically sealed between the receptacle and closure element. The gasket is preferably a deformable metal gasket and is shaped so that the gasket surrounds the opening of the receptacle. Gold or aluminum gaskets are preferred. The gasket can be hermetically sealed between the receptacle and closure element by convention means, for example, by the methods described in the preceding paragraph.

A combination of metallized sealing surfaces on the receptacle and closure element and a metallized gasket can also be employed in the present container. In such an embodiment, the gasket is sealed between the metallized sealing surface on the receptacle and the metallized sealing surface of the closure element.

In accordance with the present invention, the hermetic metallized seal between the closure element and receptacle is further hermetically sealed by providing an electrolytically applied sealing deposit on the outer surface of the seal. It is believed that this electrolytically applied sealing deposit fills in microscopic voids and even atomic voids in the metallized seal between the closure element and receptacle and thus improves the hermetic seal.

The sealing deposit can take many forms and compositions depending upon the composition of the metallized seal between the receptacle and closure element. For example, if the metallized seal is a gold seal, an electroplated gold deposit is preferred. However, other metals which will electroplate onto the metallized seal between the closure element and receptacle may also be employed.

Moreover, anodizing sealing deposits can also be employed in the present invention. For example, if the seal between the receptacle and closure element is an aluminum metal seal, aluminum oxide can be electrolytically formed on the outer surface of the seal by employing the aluminum seal as an anode in an aluminum anodizing solution (e.g., a chromic acid bath) by techniques well-known in the art.

Thus, the sealing deposit can be applied to the metallized seal between the receptacle and closure member by employing such metallized seal as the cathode or anode in an electrolytic deposition reaction, as appropriate. For example, a metal can be electroplated onto a metallized seal, e.g., a gold seal, from an appropriate solution of a salt of the metal, e.g., $Au^{+3}$ solution, by using the metallized seal as a cathode and applying an appropriate voltage across the anode and cathode to plate the metal onto the metallized seal. The appropriate voltages and other techniques used to electroplate such metals are well-known in the art and need not be discussed here.

If an electrolytically applied anodizing coating is desired, the metallized seal, e.g., an aluminum seal, is employed in the electrolyzing reaction as an anode. The anodic metallizing seal is placed in an appropriate anodizing solution, e.g., a chromic acid, sulfuric acid or oxalic acid bath, and an appropriate voltage is applied across the anode and cathode so as to anodize the metal on the outer surface of the seal. In a preferred embodiment, aluminum is employed as the metallized seal and an aluminum oxide deposit is formed on the outer surface of such seal. The thickness of the anodizing coating varies depending upon the voltage applied across the anode and cathode in the anodizing solution, as is well-known in the art. For example, for aluminum the thickness of the $Al_2O_3$ coating is about 12.3 Å/volt. Again, the voltage for electrolytically applying an anodizing coating are well-known in the art for the metals used in the seal and need not be recited here.

In the process of growing the anodizing coating on the metallized seal, the volume of the seal itself expands because the thickness of the anodizing substance is greater than the volume of the original metallized seal. For example, in the case of an aluminum electrolytically anodized seal, the $Al_2O_3$ is about 1.6 times the thickness of the Al metal consumed in the anodizing reaction. Thus, the $Al_2O_3$ coating serves to fill in any voids in the Al seal.

The sealing deposit can also cover the entire container. For example, if the closure element and receptacle are electroplatable metal, a sealing deposit can be electrolytically applied to the entire surface of the container, including the metallized seal between the receptacle and closure element. This would have particular utility, for example, in coating an container comprised of a different metal with a coating of gold in order to make the entire container inert, if desired. If the receptacle in such an embodiment contained a crystal resonator, suitable ceramic or glass feedthroughs would, however, be employed.

The invention may be more particularly described with reference to the Figures. FIG. 1 illustrates a perspective view of one embodiment of the invention exploded so as to show more particularly the individual elements of the container and how the container of the invention is prepared. In FIG. 1, receptacle 10 includes an opening 12 for mounting of a desired element, e.g., a crystal resonator. The receptacle 10 can be metal or ceramic, preferably ceramic. If a crystal resonator is mounted within the opening 12 of a metal receptacle, ceramic or glass feedthroughs are employed to insulate the crystal resonator. The surface 14 of the receptacle is a metallized surface, e.g., Al or Au. However, such a metallized surface 14 is not necessary if a metallized gasket is employed as discussed further below. In the embodiment shown, the receptacle 12 includes metallized surfaces 14 on the top and bottom surfaces of the receptacle. These metallized surfaces 14 surround the opening 12 in the receptacle.

The closure elements 16 likewise can be fabricated of ceramic or metal, preferably ceramic. In the embodiment illustrated, the portion of the closure element 16 positioned toward the receptacle includes a metallized surface 18. However, when a gasket is employed or the closure element itself is fabricated of a metal appropriate to form the hermetic seal, no metallized surfaces 18 are necessary. The metallized surfaces 18 can be any suitable metal for forming the desired hermetic seal, e.g., Au, Al, Mo-Mn alloy or W.

Metal gaskets 20 can be employed between the closure elements 16 and receptacle 10. Such gaskets are shaped so as to surround the opening 12 in the receptacle. When the closure elements 16 and receptacle 10 are formed of ceramic with no metallized surfaces thereon, the metal gaskets 20 are the primary means of forming the metallized seal between the closure elements and receptacle.

In preparing the hermetically sealed container of the invention, in the embodiment shown in FIG. 1, the closure elements 16 are fitted to the receptacle 10 with the gaskets 20 therebetween so that the gaskets 20 and metallized surfaces 14 and 18 coincide and surround the opening 12 in receptacle 10. The receptacle 10 is then hermetically sealed to the closure elements 16 and gaskets 20 at the desired reduced pressure, preferably, by the methods described in U.S. Pat. No. 3,914,836. The sealing can be preformed by any suitable means, e.g., by cold welding the metallized surfaces 14 and 18 and gaskets 20 together. The resulting hermetically sealed container is illustrated in FIG. 2, with the sealing deposit already electrolytically applied to the metallized seal.

The gaskets 20 can be provided with metal tabs 22. The tabs 22 conveniently provide an electrical connection for the application of an electrical current to the metallized seal during the electrolyzing of the metallized seal.

The hermetically sealed container is then placed into contact with an electrolyte-containing material such as an electroplating solution containing an appropriate metal salt or such as an electrolyzing anodizing solution. The metallized seal is electrically connected to the electrolyzing circuit, e.g., by the tabs 22. The metallized seal can be used as a cathode or anode, as appropriate, for the sealing deposit desired. An appropriate voltage is applied across the anode and cathode to allow the desired electrolytic reaction to occur.

Figure 2:
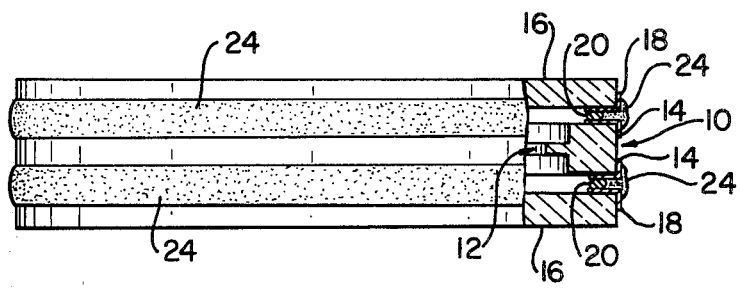
FIG. 2 is a side elevational view of one embodiment of the container of the present invention partly in cross section.

As shown in FIG. 2, the application of the voltage causes the desired sealing deposit 24 to form on the outer surface of the metallized seal. Once the desired thickness of the sealing deposit is formed on the outer surface of the metallized seal, the electrolytic reaction, i.e., electroplating or anodization, is ceased and the tabs 22 can be removed, if desired.

It will be understood that the embodiment described herein is merely exemplary and that a person skilled in the art may make many variations and modifications without departing from the spirit and scope of the invention. All such modifications and variations are intended to be included within the scope of the invention as defined in the appended claims.

What is claimed is:

1. An improved hermetically sealed ceramic container for enclosing a crystal resonator comprising a receptacle having at least one opening with said crystal resonator mounted therein; a closure element covering each said opening; an aluminum seal between said closure element and said receptacle, said aluminum seal peripherally surrounding said opening and hermetically sealing said closure element to said receptacle; and a sealing deposit of an aluminum oxide anodizing coating applied to the outer surface of said aluminum seal.

2. A container according to claim 1, wherein said aluminum seal is an aluminum gasket hermetically sealed between said receptacle and said closure element.

3. A container according to claim 1, wherein said metallized seal is a first aluminum surface on said receptacle peripherally surrounding said opening and a second aluminum surface on said closure element, said first and second aluminum surfaces being hermetically sealed together between said receptacle and said closure element.

4. A container according to claim 1, wherein said aluminum seal is a first aluminum surface on said receptacle peripherally surrounding said opening, a second aluminum surface on said closure element, and an aluminum gasket between said first aluminum surface and said second aluminum surface, said first and second aluminum surfaces and said gasket being hermetically sealed together between said receptacle and said closure element.

5. In a hermetically sealed ceramic container having a receptacle with at least one opening for mounting a crystal resonator in said opening, a closure element covering each said opening, and an aluminum seal between said closure element and said receptacle with said aluminum seal peripherally surrounding said opening and hermetically sealing said closure element to said receptacle; the improvement comprising a sealing deposit of aluminum oxide anodizing coating applied to the outer surface of said aluminum seal.

* * * * *